United States Patent [19]

Hall et al.

[11] 4,165,183

[45] Aug. 21, 1979

[54] FRINGE COUNTING INTERFEROMETRIC SYSTEM FOR HIGH ACCURACY MEASUREMENTS

[75] Inventors: John L. Hall; Siu Au Lee, both of Boulder, Colo.

[73] Assignee: The United States of America as represented by the Secretary of Commerce, Washington, D.C.

[21] Appl. No.: 827,996

[22] Filed: Aug. 26, 1977

[51] Int. Cl.² ............................................. G01B 9/02
[52] U.S. Cl. ..................................... 356/346; 356/349
[58] Field of Search ................ 356/106 R, 106 S, 346, 356/349

[56] References Cited
U.S. PATENT DOCUMENTS 4,052,129  10/1977  Schawlow et al. ............... 356/106 R Primary Examiner—John K. Corbin
Assistant Examiner—Matthew W. Koren
Attorney, Agent, or Firm—Eugene J. Pawlikowski; Alvin J. Englert

[57] ABSTRACT

A fringe counting interferometric method and apparatus is disclosed. The apparatus comprises a fringe-counting Michelson interferometer employing a velocity-stable carriage means for translating the two corner-cube retroreflectors, two phase locked oscillators and counting and control circuitry. Fringe intensity signals are counted for both a reference and unknown beam, and high accuracy is obtained by multiplying reference beam fringe signals by a fixed integral multiplier employing a phase-lock circuit. In comparing the unknown wavelength with the reference, the convenience of direct readout in wavelength units arises from the use of a high resolution preset counter.

58 Claims, 8 Drawing Figures

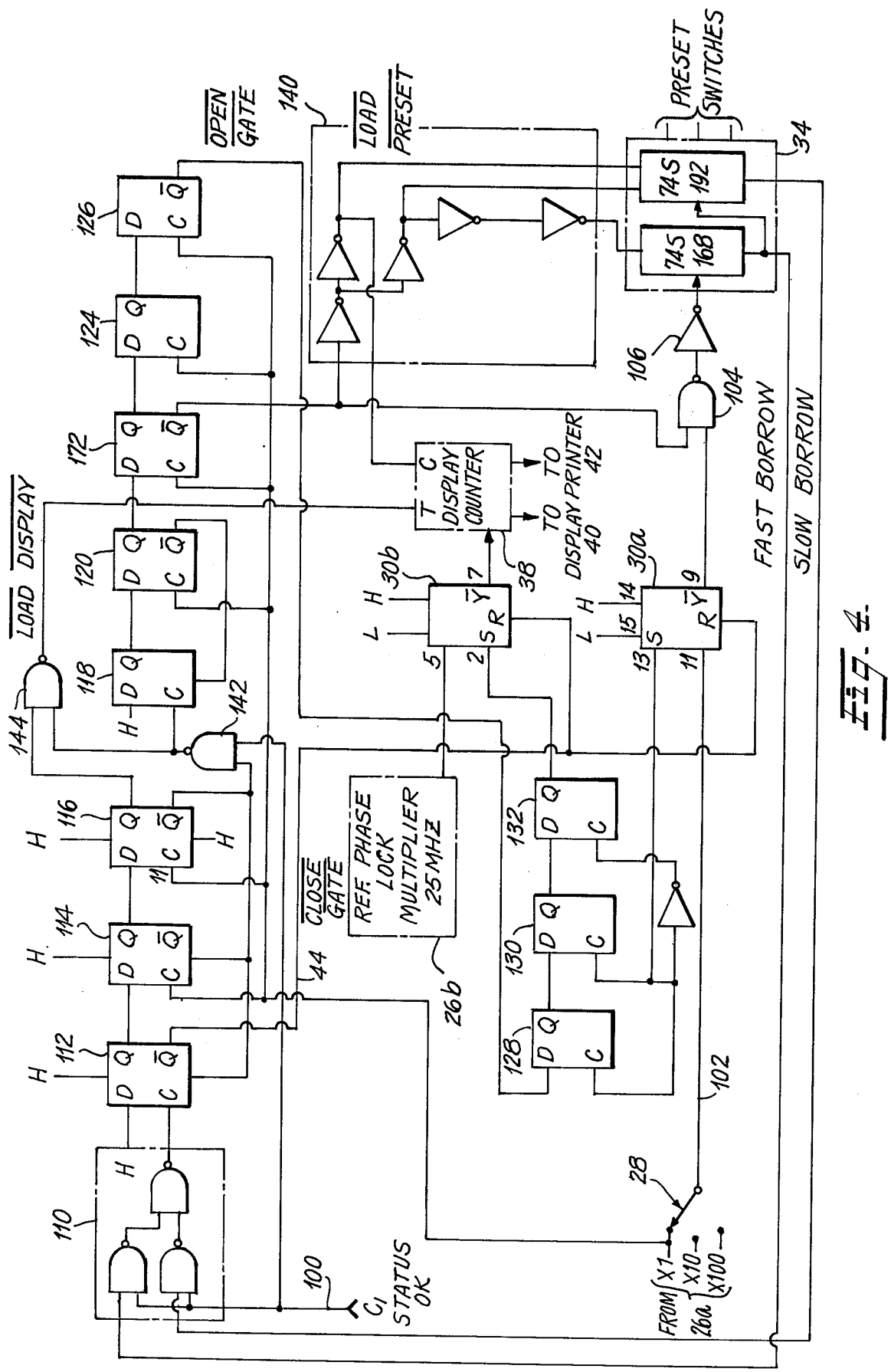

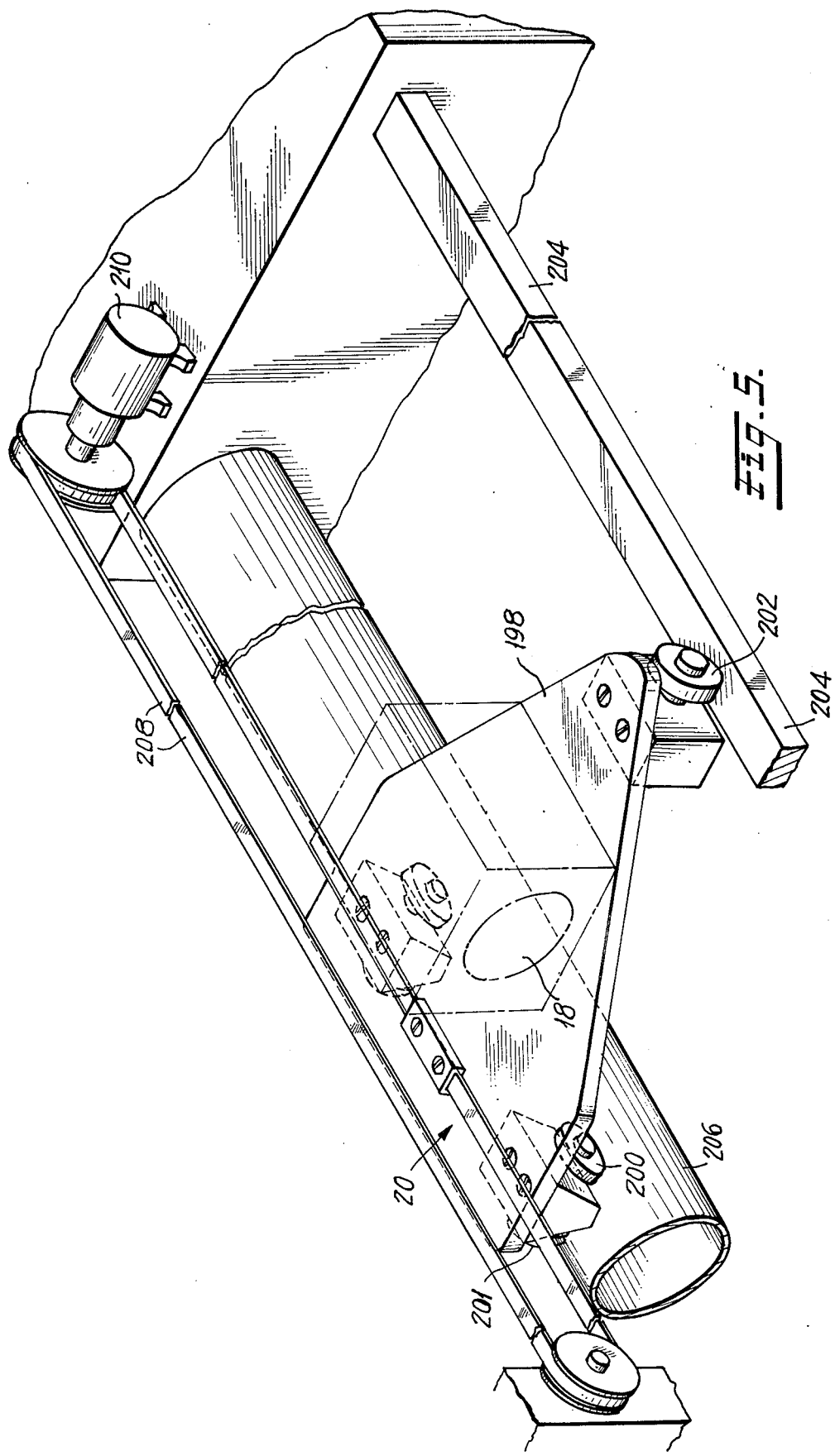

FRINGE COUNTING INTERFEROMETRIC SYSTEM FOR HIGH ACCURACY MEASUREMENTS

BACKGROUND OF THE INVENTION

1. Field of the Invention

The invention is in the field of wavelength measurements utilizing fringe counting techniques in a Michelson-type interferometer. The invention is particularly directed toward rapid and convenient measurement of cw laser radiation.

2. Description of the Prior Art

Fringe counting techniques in interferometers have long been utilized to provide an accurate determination of distances by comparing the unknown distances with the wavelength of a known source. Various optical arrangements for a Michelson interferometer including those utilizing corner-cube reflectors are disclosed in the article by W. R. C. Rowley, "Some Aspects of Fringe Counting in Laser Interferometers", *IEEE Transactions on Instruments and Measurements,* Vol. IM-15, pages 146–149, 1966. A traveling Michelson interferometer for laser wavelength determination was described by B. L. Bukovskii et al in Pribory i Teknika Eksperimenta, No. 3, pp. 175–177, May-June 1974 (translated by Consultants Bureau, Plenum Press, NY as UDC 621,317,365). Measurement techniques are also known utilizing phase-lock frequency multiplication to enhance the Doppler shift in corner-cube interferometers as discussed in the article entitled "Angstrom Measurements With Velocity-of-Light Compensation, The Remote Interferometer, and a Simple Electronic Resolution Extender", *Hewlett-Packard Journal,* December 1971, page 18. In this system, the basic frequency is defined by an intermode beat frequency of the reference laser and contains the influence of the interferometer only as a perturbation. Additionally, since this system is designed to measure displacement, only one laser wavelength is employed in its interferometer.

With the advent of the cw dye laser which may be continuously tuned over several Doppler absorption line widths, and with its application to sub-Doppler spectroscopy, it is desirable to rapidly determine the wavelength of the laser. On-line wavelength determinations with rapid updating is particularly desirable in two-photon Doppler-free spectroscopy inasumch as one is looking for weak narrow lines with no linear fluorescence.

SUMMARY OF THE INVENTION

It is an object of the invention to provide an enhanced resolution interferometer for the accurate and rapid measurement of the wavelength of an unknown radiation beam. It is a particular object of the invention to provide an essentially real-time wavelength determination and readout for a cw laser source.

It is a further object of the invention to provide a frequency multiplication of the basic fringe rates associated with uniform translation of the carriage bearing the interferometer's retroreflectors. This multiplication of frequency will lead to enhanced resolution or decreased measurement time or both. In this way, fringe interpolations are made by using frequency measuring methods (counting) rather than by using analog length metrological techniques.

In accordance with the invention, apparatus is disclosed for measuring the wavelength of a collimated object beam of electromagnetic radiation using a reference laser beam of known wavelength. The apparatus comprises an interferometer of the Michelson-type including carriage means for translating the retroreflection means to provide a variable optical path for said reference and object beams. Means are provided for directing the reference and object beams into the interferometer and for detecting intensity fringes from the interferometer of said reference and object beams as the carriage means is translated. The detecting means provides electrical signals corresponding to the reference and object fringes. Means are further provided for multiplying the electrical fringe signals of the reference beam by an integral multiplier, L, which are subsequently counted by counters. Although other frequency multiplying techniques may be used, a phase-locked oscillator is a particularly suitable and convenient means for establishing a phase-stable electrical signal at a (higher) multiple of the electrical fringe signal frequency. Reference and object beam fringe signals, or their frequency-multiplied images are routed through gates to separate counters. Means are provided to use one counter to control the gates so as to normalize the displayed unknown wavelength, thus presenting the unknown laser's wavelength directly in Angstroms or its wave number directly in inverse centimeters.

In accordance with the invention there is also disclosed two interferometers of the Michelson-type for measuring the wavelength or wave number of an object beam using a reference beam of known wavelength. The interferometer comprises a beam splitter, means for directing the reference and object beams onto the beam splitter to form first and second pairs of reference/object beams, first and second corner-cube reflectors, first reflection means positioned to direct the first pair of reference/object beams onto and from the first corner-cube reflector and second reflection means positioned to direct the second pair of reference/object beams onto and from the second corner-cube reflector. Additionally, carriage means are provided for supporting the first and second corner-cube reflectors and for moving the corner-cube reflectors along a fixed path. The carriage means is specifically designed to maintain optical alignment during travel and to be vibration free and comprises a first and second Vee mounted pair of wheels which travel on an elongated rod and an additional support wheel which travels on a planar surface substantially parallel to the elongated rod to define the carriage travel path.

BRIEF DESCRIPTION OF THE DRAWINGS

These and other objects of the invention will become clear in reference to the foregoing specification wherein:

FIG. 4 is a schematic diagram of the sequence controller utilized in the embodiment of FIG. 1;

FIG. 5 is a perspective view of the carriage mechanism utilized in the invention;

DETAILED DESCRIPTION OF THE PREFERRED EMBODIMENT

Figure 1:
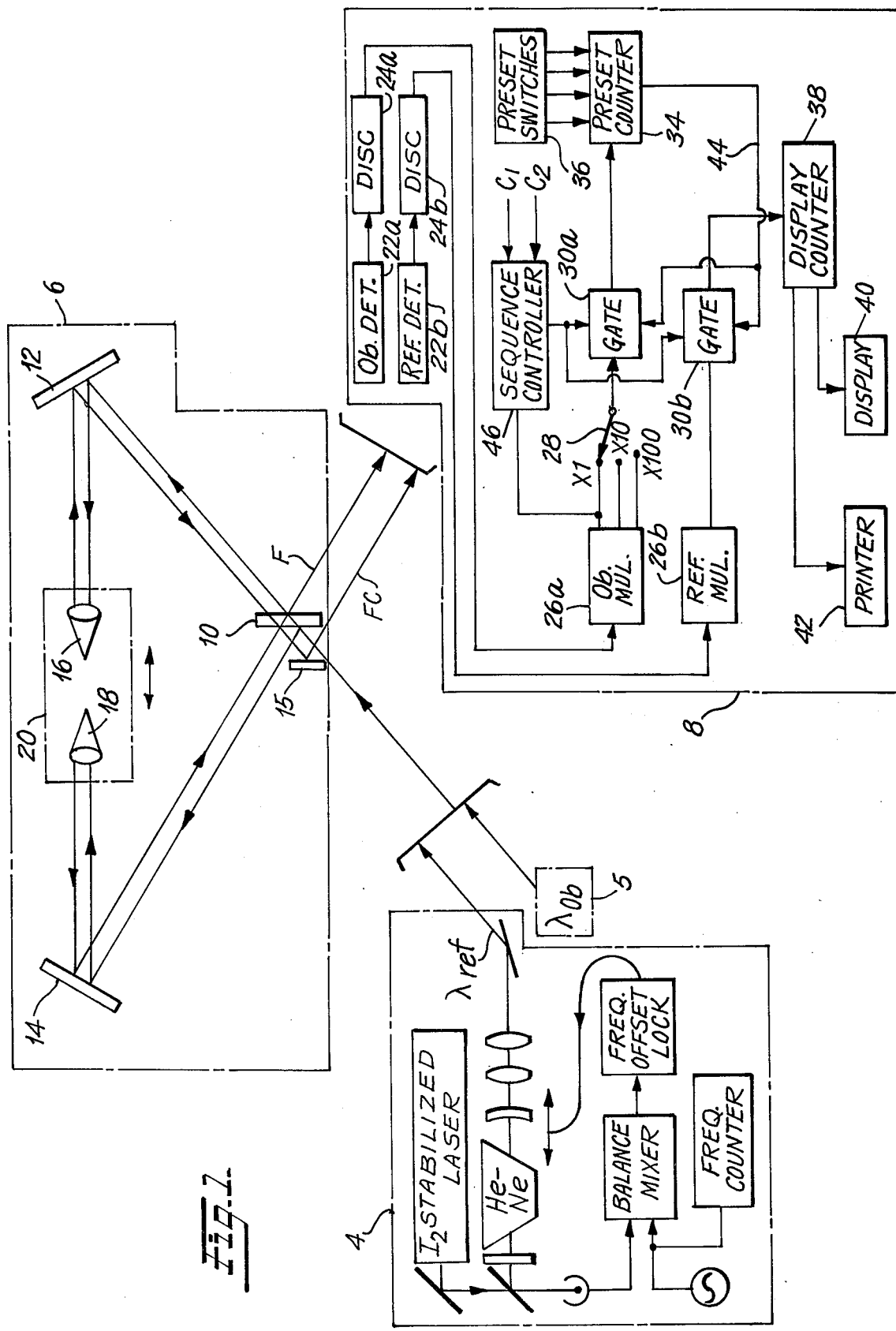
FIG. 1 is a schematic diagram of the optical scanning mechanism and a block diagram of the associated electronics.

The basic optical and electronic schematic diagram of the invention is illustrated in FIG. 1. The interferometer system 2 is seen to comprise three primary parts, namely, a stable reference laser source 4, the interferometer proper 6, and the detection and processing circuitry 8. The stable reference source 4 may comprise, for example, a He-Ne laser source stabilized by an $I_2$-stabilized reference laser, or simply the $I_2$-stabilized reference laser itself. The operation of the stable reference source is well known to those of skill in the spectroscopy art and reference is made to more detailed descriptions, such as, "Description, Performance and Wavelengths of Iodine Stabilized Lasers", Schweitzer, Jr. et al, *Applied Optics*, Vol. 12, No. 12, December 1973, page 2927ff, and Barger et al, *Phys. Rev. Lett.*, 22,408 (1969). Reference is also made to applicants' publication "Interferometer Real-Time Display of CW Dye Laser Wavelength With Sub-Doppler Accuracy", J. L. Hall, and S. A. Lee, *Applied Physics Letters*, Vol. 29, No. 9, September 1976, page 367. Element number 5 indicates the laser source to be measured. One may refer to this source as providing an object beam of wavelength $\lambda ob$, to distinguish it from the reference wavelength, $\lambda ref$.

The elements of the interferometer per se designated by number 6 are seen to comprise a partially reflecting mirror or beam splitter 10, reflectors 12,14 and 15 and corner-cube retroreflectors 16 and 18. The corner-cube retro-reflectors 16 and 18 are mounted on a carriage 20 which translates back and forth as indicated by the arrow. Upon translation of the carriage the optical path of the reference beam lengthens on one side and shortens on the other. A resulting light and dark intensity pattern (fringes) are detected in the detection and processing circuitry 8. A more detailed description of the carriage 20 is given hereinafter.

FIG. 1 shows two beams, F and FC, emanating from beam splitter 10. It is understood that beam F represents the optical fringe signals for both reference and object beams. Use of the complementary fringe beam FC is optional, but is particularly attractive for object laser sources with large amplitude noise.

Figure 6:
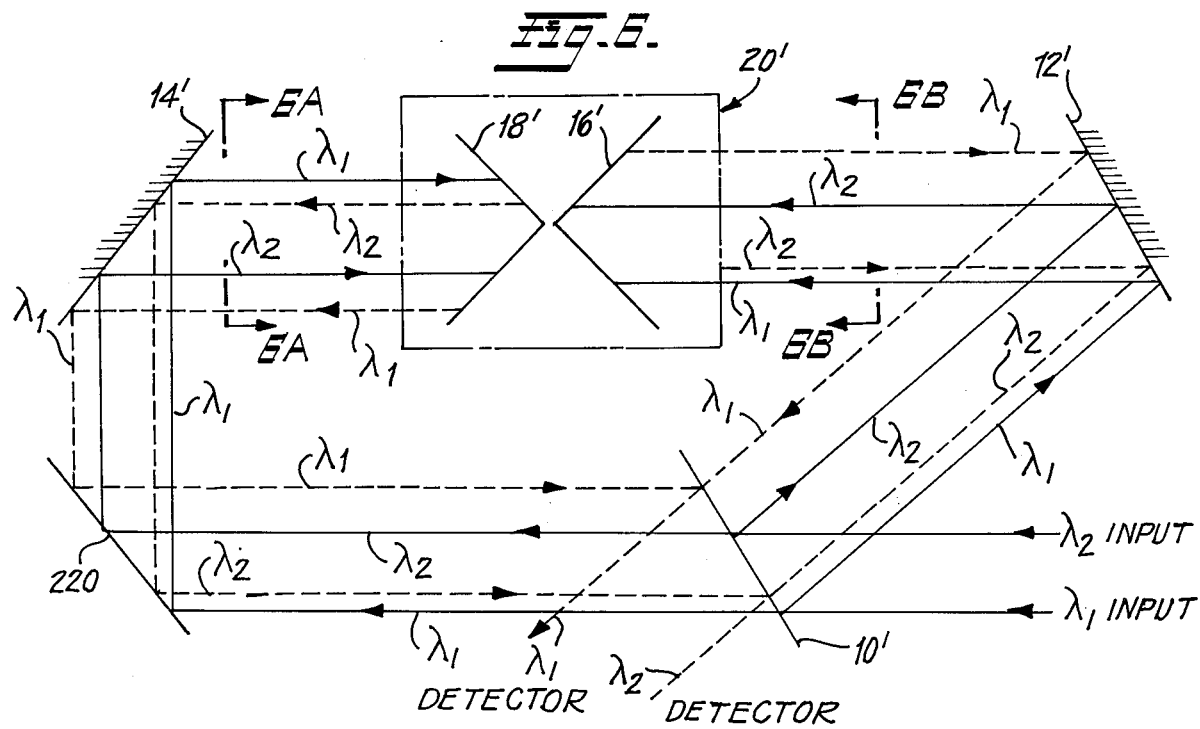
FIG. 6 is an optical schematic diagram of another embodiment of the interferometer of the invention.

The object and reference beams may be kept spatially separate during their entire propagation from source, through the interferometer 6 and to separate detectors. Separation is maintained by using separate sectors of the corner-cube reflectors. Optionally, the two beams may be superimposed and reflected by the same section of the corner-cubes. In the latter approach, dichroic filters may be employed to separate the beams before detection. For simplicity of illustration, FIG. 1 shows only one optical path through the interferometer 6. Another embodiment of the invention shown in FIG. 6 illustrates two separate beam paths for the reference and object beams. In the case that spatially-overlapped beams are utilized, an auxiliary beam divider (not shown) in the optical input path to interferometer 6 can be used to recover the fringe complement signal.

The detection and processing circuitry 8 is seen to comprise two detecting systems, a reference detecting system 22b for detecting the fringes resulting from the known or reference radiation source, and an object detecting system 22a for detecting the fringes from the unknown radiation source whose wavelength is to be measured. Signals from the object detector 22a and the reference detector 22b are passed to discriminators 24a and 24b respectively to provide digital reference and object fringe signals which are subsequently fed to phase-lock multipliers 26a and 26b. Phase-lock frequency multipliers 26a and 26b multiply the frequency (phase) of these signals by fixed factors, such as K and L respectively. Typically, $K=L=100$. Each multiplier also produces decade-reduced images of this output, e.g. K/10 and K/100. Note that since each optical fringe gives rise to one count at the input, each of these frequency-multiple output counts corresponds to a distance which is a submultiple of one optical fringe, i.e. 10 to 100 counts have been synthesized for each one fringe of optical path difference. In what follows, these frequency-multiplied signals will be referred to as (fringe) submultiple signals. Object submultiple signals from the phase-lock multiplier 26a are fed via a resolution switch 28 to gate 30a and subsequently to preset counter 34. Preset counter 34 is preset with a given integer number as determined by preset switches 36. The reference submultiple signals of phase-lock multiplier 26b are fed via a gate 30b to a display counter 38 and subsequently to display 40 and/or printer 42. The preset counter 34 controls the operation of gates 30a and 30b by means of an inhibit line 44 which is activated to place the gates in their blocking condition ("closed") after the preset count is reached. The preset counter 34 is set via the preset switches 36 with an integral number which may conveniently be set to a decade multiple of the known reference wavelength. Such a presetting of the preset counter 34 will enable direct readout of the unknown wavelength on the display counter 38.

It is noted that the "fringes" associated with a given radiation beam may not simultaneously appear over the detector surface, but rather, the detector is used to measure the central intensity fringe which is circular and substantially covers the detector surface. The central "fringe" varies from high to low intensity, and the detector produces electrical signals corresponding to these intensity variations.

Also illustrated in FIG. 1 is a sequence controller 46 utilized to enable gates 30a and 30b after stabilized operation is achieved, namely, after the carriage 20 is up to speed, and the phase-lock multipliers are operative in phase lock. The sequence controller may receive a number of control signals $C_1$ and $C_2$ being representative of certain of these operation conditions. These control signals may be derived from the carriage mechanism or other parts of the detection and processing circuitry 8. For example, signal $C_1$ may be derived from an end of carriage travel sensor activated by the carriage 20, and signal $C_2$ may be derived from the phase-lock circuitry to indicate an acceptable phase-lock operating condition. Alternately, a single control signal, $C_1$, may be used to represent the logically ANDed condition for these or additional operational status conditions. In the description following $C_1, C_2 \ldots C_N$ are represented by a single "status O.K." signal.

The interferometer system 2 counts the unknown wavelengths or object wavelengths in terms of the reference wavelength. In order to obtain a higher resolution than heretofore possible, or in order to obtain a given resolution in a relatively shorter time, the apparatus utilizes a frequency multiplying phase-lock circuit as depicted in FIG. 1 to provide an L-fold resolution enhancement. The utilization of corner-cube retroreflectors provides an intrinsic automatic alignment of the interferometer and a displacement between the input and output beams enabling a decoupling from the laser sources (both reference and object). Separate pairs of the sectors of the corner-cube are used for the reference and object beams to facilitate their separate introduction into and recovery from the interferometer 6. The known and object laser wavelengths produce interferometric fringes which are approximately sinusoidal in time and are detected by the detectors 22. The pulse rates for the fringes are given by $f_k = 4n_k v/\lambda_k$ where v is a carriage velocity, $\lambda_k$ is the known or unknown wavelength and $n_k$ is the appropriate index of refraction. k is the index which designates either the known or unkonwn wavelength. The integer 4 arises from the folded optical path arrangement of the interferometer. Under nominal operating conditions of the apparatus the reference fringe frequency is approximately 250 kHz.

In utilizing the system of FIG. 1, the object wavelength may be determined utilizing the equation:

$$\lambda_{ob} = \frac{us\,sLC}{N}\left(1 + \frac{n_{ob} - n_{ref}}{n_{ref}}\right)$$

where:
$\lambda_{ob}$ = the object wavelength;
C = the counted number of submultiple signals counted in display counter 38;
N = the given integral number set into preset counter 34 and equal to the counted number of object submultiple signals;
L = the multiplication factor for phase lock multiplier 26b;
$\lambda_{ref}$ = the reference wavelength;
$n_{ob}$ = the index of refraction for $\lambda_{ob}$; and
$n_{ref}$ = the index of refraction for $\lambda_{ref}$.

In this equation the object multiplier resolution switch is assumed to be set to X1.

Preset counter 34 is utilized to inhibit pulses from the reference detector passing through gate 30b onto the display counter 38. Consequently, whenever the preset count is reached in preset counter 34, an inhibit signal is placed on inhibit line 44 and gate 30b is no longer open. Similarly, gate 30a is closed. The number of counts accumulated in the display counter 38 is related to both the preset counter number in preset counter 34 and the fraction of the reference wavelength which has been accumulated prior to inhibiting gate 30b. The fraction of the reference wavelength is determined to within 1/Lth of the wavelength inasmuch as the frequency phaselock multiplication factor is L. In the preferred embodiment L is set to 100 but obviously other values may be utilized.

Figure 2:
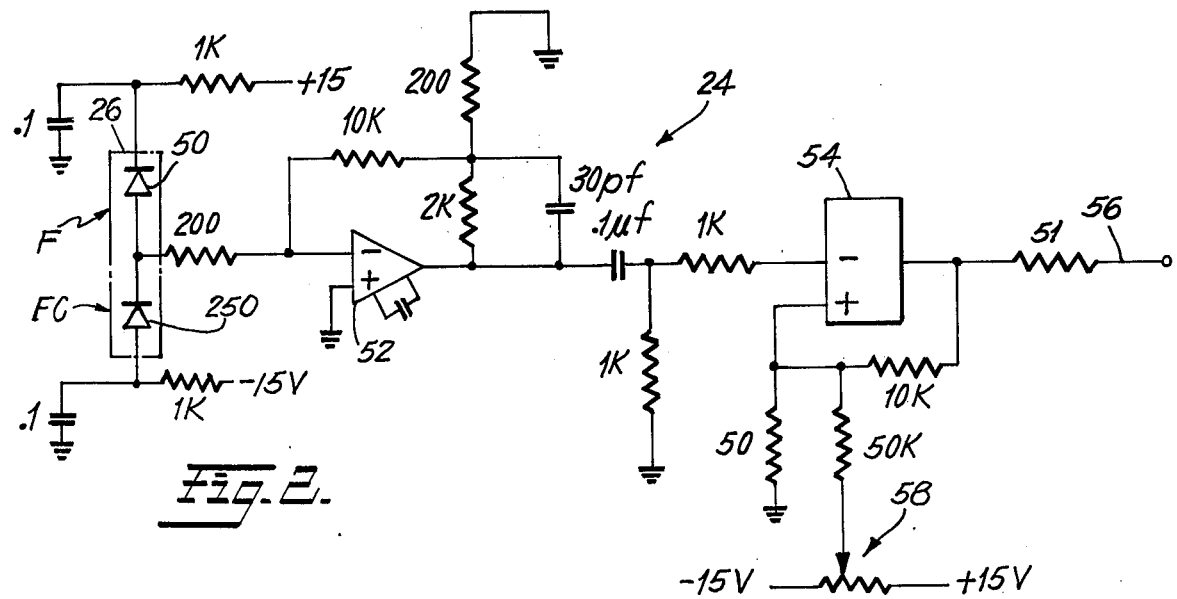
FIG. 2 is a schematic diagram of the discriminator utilized in the embodiment of FIG. 1.

FIG. 2 illustrates the discriminator circuit 24a of FIG. 1. The same discriminator circuit may be employed for the reference channel. The fringes F are detected by means of a fast photodiode 50 such as Hewlett-Packard Model 5082-4220, and the analog signal is passed to an op amp 52 (National, Model LH032) operating as a current-to-voltage converter. The complementary fringe signals FC are detected by means of a fast photodiode 250, electrically equivalent to photodiode 50 but connected with the reverse polarity. The output of photodiode 250 is also passed to op amp 52. The noise cancellation function of this second signal channel will be described momentarily. The combined output from op amp 52 is fed to discriminator 54, for example TI Model 72510. The discriminator output is fed along line 56 to the input of the phase-lock multiplier 26 as more particularly described in relation to FIG. 3. The discriminator 54 may be set by means of an offset potentiometer 58 which may conveniently be set to trigger the discriminator on the positive to negative zero crossing of the sinusoid. For the reference discriminator, the output frequency along line 56 is nominally 250 kHz.

For measurement of object laser sources with appreciable amounts of amplitude noise, it is attractive to utilize both the fringe beam F and the fringe complement beam FC, as detected by photodiodes 50 and 250. Without the complement signal, the capacitive coupling shown into discriminator 54 (FIG. 2) ensures that the fringe is discriminated near the maximum slope region at its center. Nevertheless this level still represents a transfer of ½ the maximum laser fringe power (and its noise) into the detector. Thus amplitude noise on the laser can be troublesome, (especially amplitude noise components near the fringe frequency), since it effectively maps intensity noise into phase noise. A simple and effective noise suppression technique involves directing the fringe complement signal FC into photodiode 250 as described above. Since this fringe complement beam has also traversed the interferometer it does in fact carry fringe information complementary to that of the employed object and reference fringe beams. Thus there will be a succession of carriage positions at which the two photocurrents cancel exactly at the output of op amp 52. Assuming a reasonable efficiency balance between these two photodetector channels, the discriminator trigger point will be rather close to the optimum maximum slope portion of the fringe sinusoid and also rather close to the position of perfect amplitude noise cancellation.

The extra components, photodiode 250 and its associated biasing circuitry, may be omitted if laser amplitude noise is not significant. For example the amplitude noise of the reference laser may well be essentially negligible.

Figure 3:
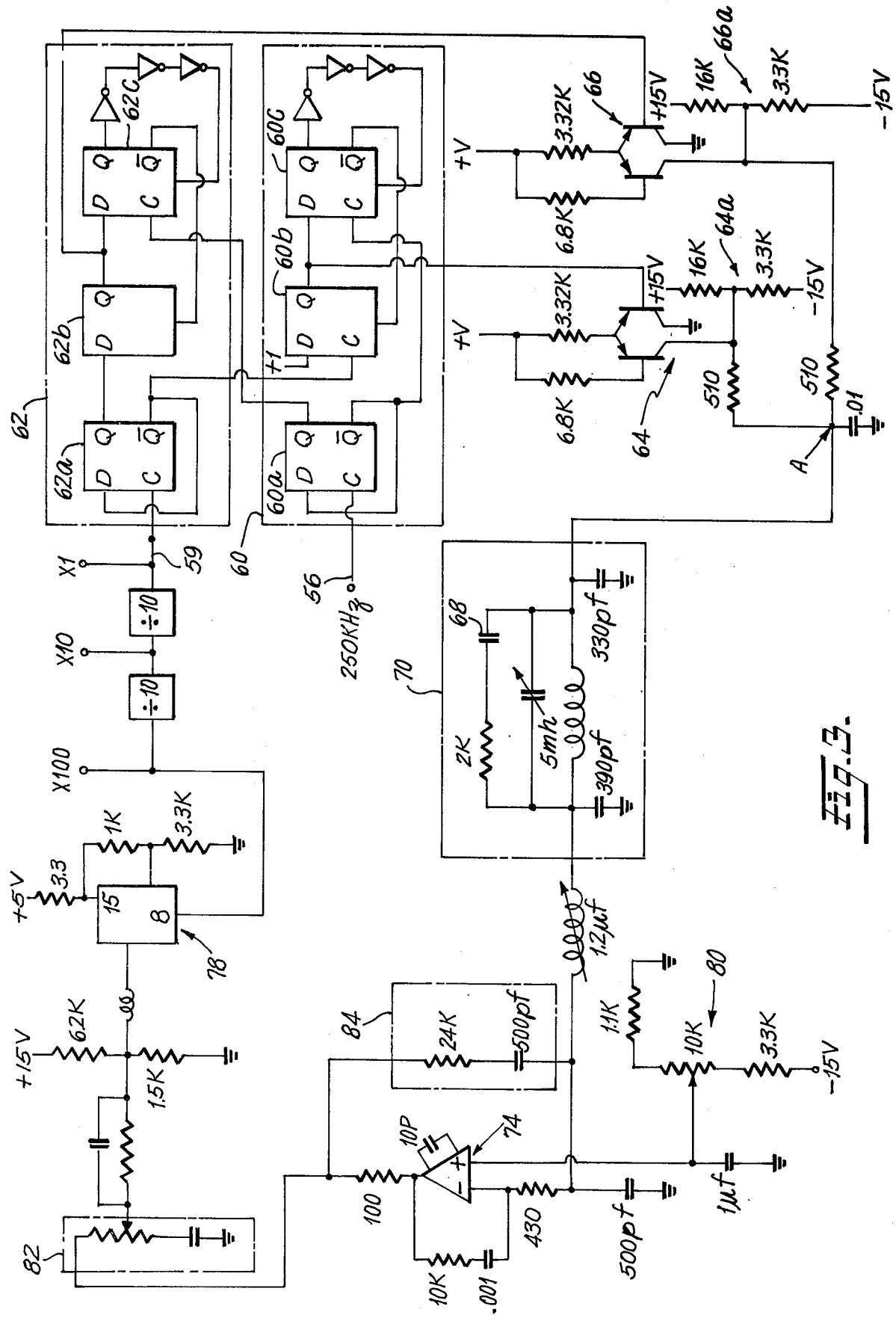
FIG. 3 is a block diagram of the phase-locked frequency multiplier utilized in the embodiment of FIG. 1.

As shown in FIG. 3, the phase-lock multiplier 26a (representative also of multiplier 26b) comprises a first plurality of flip-flops 60 fed by the line 56 from the output of discriminator 54 (FIG. 2) and a second plurality of flip-flops 62 fed from a divided down output of the multiplier 26 along line 59. Flip-flops 60a and 62a serve to provide a symmetric waveform having half the frequency of the original trigger signals (250 kHz). Flip-flops 60b–60c and 62b–62c each operate as phase detectors by providing control signals having rising and falling edges timed to the output of the multiplier 26 (line 59 via flip-flop 62a) and the input to the multiplier 26 (line 56 via flip-flop 60a). The output from flip-flops 60b and 62b are fed respectively to current switching transistor circuits 64 and 66. The summed switched currents of transistor circuits 64 and 66 at point A are filtered by means of notch filter 70 (set at 250 kHz) and subsequently passed to op amp 74 (for example, National LM741). The output of op amp 74 is fed to voltage controlled oscillator 78 as for example TI model 74S124. The oscillator 78 may conveniently be set to multiply by the factor 100 (K=100), and a plurality of outputs are provided having resolution X1, X10 and X100. The X1 output is utilized as the input to the second plurality of flip-flops 62 along line 59.

The operational amplifier 74 is set by means of a potentiometer 80 to balance (provide zero output) at −5 volts which is the set point for the summed output of current switching transistor circuits 64 and 66. The set or "balancing" point, selected at 50% duty cycle, for each current switching transistor circuit 64 and 66 is controlled by means of voltage dividers 64a and 66a respectively. Thus, if there is a phase lock condition, the summed output of the current switching transistors 64 and 66 at point A will be $-5$ volts so that no correction voltage will be generated at the output of op amp 74. It is noted that an integration circuit 84 is also provided across op amp 74 to smooth out phase errors and rate of changes in the phase errors, which errors may, for example, be associated with amplitude noise in the fringe signals as it influences the discriminator switching. Further, a gain setting network 82 is provided to control overall circuit gain. A sufficiently high gain and so a rapid closed loop response is provided that the phase-locked oscillator can precisely follow the frequency variations introduced by variations in the carriage velocity. The phase-locked frequency multipliers may be well regarded as providing an electrical phase that passes through L units of $2\pi$ (100 units in the present case) for each $2\pi$ variation of the optical and electrical input, that is to say for each complete optical fringe. A comparison of the electrical phase and the equivalent optical phase is made at each fringe zero-crossing, and the phase error (averaged over roughly 10 fringes) is used to correct the voltage-tuned oscillator 78, for example, in response to gradual speed changes of the moving carriage. Since a phase lock with appropriate loop filter can be shown to provide the optimum interpolation/extrapolation algorithm, it may be seen that this phase-locked multiplier concept provides both higher resolution and higher precision than the alternative technique of simple wideband fringe-counting.

The sequence controller 46 is illustrated in FIG. 4 in combination with the display counter 38, preset counter 34, gates 30a and 30b and resolution switch 28. A status input line 100 supplies one of the status (or control) signals $C_1$ to the sequence controller 46. In the preferred embodiment, the status signal $C_1$ is representative of the proper operation of the phase lock multipliers ANDed with a "not end of travel carriage" signal. Resolution switch 28 provides the input count signals from multiplier 26a to the present counter 34 via line 102, gate 30a, NAND gate 104 and inverter 106. As seen in FIG. 4, the sequence controller further comprises AND circuit 110, flip-flops 112–132 and driver circuit 140. A NAND gate 142 is also shown having one input supplied by the status signal $C_1$ and a second input provided by the Q output of flip-flop 116. NAND gate 142 has an output which feeds the clock or trigger input to flip-flop 118 and also feeds NAND gate 144. A second input to NAND gate 144 is provided by the Q output of flip-flop 116. Signals from the reference phase-lock multiplier 26b are fed into gate 30b via a line 150, and the output of gate 30b is fed directly to the display counter 38.

In operation, the status signal fed in along line 100 is supplied to AND circuit 110 together with fast/slow borrow outputs from the preset counter 34 which indicate that the preset counter 34 has not as yet reached the preset count condition. The output of AND circuit 110 is fed to the first of three flip-flops 112, 114 and 116. When the preset counter reaches its preset number the fast borrow goes low while the slow borrow from the more significant decades had already developed its low level. After inversion, the AND feeding 112 is thereby enabled, triggering FF112 and generating the CLOSE GATE signal via $\overline{Q}$. This information is synchronized to the clock by FF114 and delayed 1 clock pulse width by 116 before loading contents of display counter 38 into display register 40. If status is lost, for example, if the carriage has reached the end of its travel, the NAND gates 142 and 144 block the propagation of the LOAD DISPLAY pulse from FF116.

Once status is subsequently restored and/or a new measurement is ready to be taken, flip-flops 116–126 provide for the loading of preset counter 34 and for the opening of gates 30a and 30b. Flip-flop 122 has a $\overline{Q}$ output connected to the driver circuit 140 which strobes the loading of the preset switches (not shown) into the present counter 34. Driver circuit 140 also clears the display counter 38 so that another reading may be accumulated. Flip flops 124 and 126 provide guard times for the loading of the preset counter 34 and clearing of the display counter 38. An additional time delay is provided by the flip-flops 130 and 132 to delay opening of gates 30a and 30b to allow signal propagation time in preset counter 34. Flip-flop 128 is utilized to synchronize the open gate signal from the output of flip-flop 126 with the incoming count signals associated with the object wavelength via resolution switch 28.

In the preferred embodiment, gates 30a and 30b may each be one-half of an integrated circuit Model 74120, and the preset counter may be fabricated from integrated circuit chips Models 74S168 and 74LS192.

FIG. 5 illustrates details of the carriage 20 utilized to carry the corner-cube reflectors 16 and 18. The carriage is designed to provide for a nearly uniform velocity of travel and to insure that the carriage movement is both smooth and constantly aligned with the desired optical axis. The carriage has a support frame 198 which mounts by a three point kinematic means comprising a pair of "V" shaped wheel mounts 200 and 201 and wheel mount 202 traveling on a planar or flat surface 204. The "V" shaped mounts 200 support the carriage along a metallic tube 206, and the mounts may comprise, for example, wheels fabricated from a material such as VESPEL. Carriage 20 may be pulled along the tube 206 and railway 204 by means of a mylar tape 208 attached to the carriage 20 and to a drive shaft of a reversible synchronous motor 210. To minimize axial vibrations it is useful to design the carriage to place the center of mass in the plane of contact of the wheels.

Figure 6A:
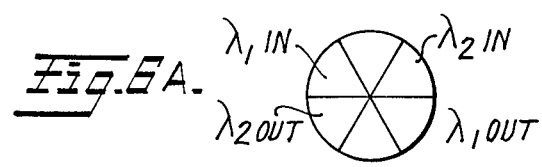
FIGS. 6A and 6B show beam reflections from the corner-cubes of the embodiment of FIG. 6.
Figure 6B:
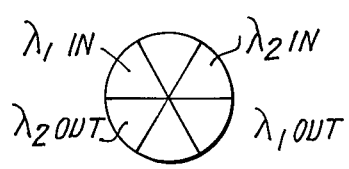

FIG. 6 illustrates another embodiment of the invention wherein four folding mirrors are utilized. In this embodiment, the interferometer has a quadrangular topology rather than the triangular topology shown in FIG. 1. Primes are utilized to label similar elements as those shown in FIG. 1. The quadrangular geometry is made possible by means of the additional reflecting surface 220. A particular advantage utilizing the geometry shown in FIG. 5 is that the reference and object beams are spatially interchanged in the two arms of the interferometer. Thus, alignment of the object laser beam to be parallel with the reference beam and with the carriage translation can be greatly simplified by merely lifting the carriage out of the optical path and insuring that the reference laser beam traces out in reverse direction the path required by the input object beam. Thus, one merely has to collimate the object beam so that it is coincident and parallel to the reference beam emerging when the carrier is temporarily removed. This feature is particularly useful in measuring infrared and other "invisible" laser wavelengths. FIGS. 6A and 6B illustrate the reflections from corner cubes 16' and 18' of the embodiment of FIG. 6 taken respectively along lines 6A—6A and 6B—6B thereof. As can be seen, the object and reference beams remain spatially separate throughout their propagation in the interferometer.

It is noted that the interferometer may be utilized to measure the wavelength directly or the wave number as required. For example, if one wishes to measure the wave number, which is the number of fringes per centimeter of the object radiation, one merely has to feed the output from the reference detector channel to the preset counter channel and use it to count up to the reference wave number. The preset switches are then set to the inverse wavelength of the reference radiation. The present counter will then automatically be preset to the proper wave number to provide for a wave number output of the object beam when measurement actually takes place. The output of the object detector will then feed the display counter channel and will be displayed directly in wave number units. It is thus seen that the measurement of the object wave number is equivalent to the measurement of the object wavelength, but the direct display in wave number units may have some special advantages in some cases. A switch (not shown in FIG. 1) may be provided to allow a quick interchange of the electrical fringe signals feeding the object multiplier 26a and reference multiplier 26b. In this manner means may be provided for enabling the apparatus to be easily changed from a wavelength measurement apparatus to a wave number measurement apparatus.

It is also noted that the triangular topology scheme utilized in the interferometer of FIG. 1 has the particular advantage of spatially separating out the object and reference beams which is convenient for insertion of the beams from opposite sides of the beam splitter 10.

Small measurement errors may arise in the described techniques with separated beams due to the joint effect of alignment errors and imperfections in the cornercube's retroreflection characteristics versus position across its face. Consequently, wavelength separation techniques such as the utilization of dichroic filters could also be employed wherein both the object and reference beams are directed through one and the same sector of the corner-cube. This approach minimizes the errors noted above. In this approach it is also noted that the two overlapping beams could be returned into the then-unused other two sectors of the corner-cubes to increase resolution another three-fold. Alternatively, the overlapping beams could be centered on the corner-cube retroreflector to provide a larger usable aperture, which would be of interest in reducing the diffraction effects associated with the longer wavelength of an infrared object beam.

While the invention has been described with reference to the particular embodiments set forth, it is understood that certain modifications and improvements may be made by those of skill in the art and it is understood that the invention is intended to cover all such modifications and improvements which fall within the scope of the appended claims.

We claim:

1. Apparatus for measuring the wavelength of an object beam of collimiated electromagnetic radiation using a reference beam of known wavelength comprising:

(a) an interferometer of the Michelson-type including reflection means and carriage means for translating said reflection means to provide a variable optical path for said reference and object beams, (b) means for directing said reference and object beams to said interferometer, (c) means for detecting intensity fringes from said interferometer of said reference and object beams as said carriage means is translated, said detecting means thereby providing electrical signals corresponding to said reference and object fringes, (d) means for phase-lock multiplying the number of electrical fringe signals of said reference beam by L, L being an integer multiplier greater than unity to provide reference submultiple signals equal in number to L times the number of electrical fringe signals of said reference beam, (e) means for counting said reference submultiple signals, and (f) means for controlling said counting means to count said reference submultiple signals in response to said electrical fringe signals corresponding to said object beam, whereby the number of reference submultiple signals counted by said counting means corresponds to the wavelength of said object beam.

2. Apparatus as recited in claim 1 wherein said controlling means comprises:

(a) gate means for passing said reference submultiple signals to said counting means, (b) means for opening said gate means at the beginning of said measurement, and (c) means for closing said gate means in response to a given number of electrical fringe signals corresponding to said object beam.

3. Apparatus as recited in claim 2 wherein said closing means comprises presettable counting means connected to count said electrical fringe signals corresponding to said object beam, said presettable counting means preset with said given number.

4. Apparatus as recited in claim 3 wherein said given number is an integral number and said apparatus further comprises:

(a) additional multiplying means for multiplying the electrical fringe signals of said object beam by K, K being an integral multiplier greater than unity to to provide object submultiple signals equal in number to K times the number of electrical fringe signals of said object beam, and (b) said presettable counting means is preset at said given number and connected to count said given number of object submultiple signals, whereby said closing means is operative to close said gate after said presettable counting means counts said given number of object submultiple signals.

5. Apparatus as recited in claim 4 wherein said object and reference beams comprise laser radiation.

6. Apparatus as recited in claim 4 wherein $K=L$.

7. Apparatus as recited in claim 6 wherein $K=L=100$.

8. Apparatus as recited in claim 4 wherein said additional multiplying means comprises additional phase-lock multiplying means, and said phase lock multiplying means and said additional phase-lock multiplying means each comprise:

(a) means for comparing the phase of the submultiple signals and the electrical fringe signals for providing a voltage signal corresponding thereto, and (b) a voltage to frequency converter connected to receive said voltage signal and for providing said submultiple signals.

9. Apparatus as recited in claim 8 wherein said voltage to frequency converter is a voltage controlled oscillator.

10. Apparatus as recited in claim 8 wherein K=L=100.

11. Apparatus as recited in claim 1 wherein said means for controlling said counting means comprises means responsive to object submultiple signals derived from multiplying said object electrical fringe signals corresponding to said object beam by an integral number K.

12. Apparatus as recited in claim 11 wherein said controlling means comprises a presettable counter preset at a given integral number and connected to receive said object submultiple signals, said presettable counter operative to count a given number of object submultiple signals for controlling the counting of said means for counting said reference submultiple signals.

13. Apparatus as recited in claim 12 wherein K=L=100.

14. Apparatus as recited in claim 12 further comprising means for selectively adjusting the integral value of K whereby the resolution of measurement may be selected.

15. Apparatus as recited in claim 12 further comprising means for presetting said presettable counter at said given number.

16. Apparatus as recited in claim 11 wherein multiplying by the integral number K is done by a phase-lock loop multiplier.

17. Apparatus as recited in claim 1 wherein said carriage means comprises:
(a) a frame for securing said reflection means,
(b) first and second "V" mounted pairs of wheels, each pair connected to said frame for supporting same, and aligned with one another adjacent one side of said frame,
(c) an additional support wheel connected adjacent the other side of said support frame,
(d) an elongated rod, said rod forming the surface on which said first and second V mounted pairs of wheels travel, and
(e) a planar surface substantially parallel to said elongated rod, said planar surface forming the surface on which said additional support wheel travels.

18. Apparatus as recited in claim 17 further comprising motor means for driving said carriage means along a path formed by said rod and planar surface.

19. Apparatus as recited in claim 17 wherein said reflection means comprises two corner-cube reflectors.

20. Apparatus as recited in claim 19 wherein said corner-cube reflectors are mounted on opposite sides of said carriage means and positioned to reflect said object and reference beams in a direction parallel to the path travelled by said carriage means.

21. Apparatus as recited in claim 20 wherein said object and reference beams are spatially separated prior to entering said interferometer and remain spatially separated by passing through different segments of said corner-cubes whereby said object and reference beams are spatially separated upon leaving said interferometer.

22. Apparatus as recited in claim 21 wherein said means for detecting said reference and object beams comprise separate detectors for each beam.

23. Apparatus as recited in claim 22 wherein said interferometer further comprises a beam splitter and first and second reflectors for directing said beams in two branches defining a triangular topology, said corner-cube reflectors positioned between said first and second reflectors.

24. Apparatus as recited in claim 22 wherein said interferometer further comprises a beam splitter and first, second, third and fourth reflectors for directing said beams in two branches defining a quadrangular topology, said beam splitter positioned between said first and second reflectors and said corner cube reflectors positioned between said second and third reflectors.

25. Apparatus as recited in claim 1 wherein said reflection means comprises two corner-cube reflectors.

26. Apparatus as recited in claim 25 wherein said corner-cube reflectors are mounted on opposite sides of said carriage means and positioned to reflect said object and reference beams in a direction parallel to the path travelled by said carriage means.

27. Apparatus as recited in claim 26 wherein said object and reference beams are spatially separated prior to entering said interferometer and remain spatially separated by passing through different segments of said corner-cubes whereby said object and referenece beams are spatially separated upon leaving said interferometer.

28. Apparatus as recited in claim 27 wherein said means for detecting said reference and object beams comprise separate detectors for each beam.

29. Apparatus as recited in claim 28 wherein said interferometer further comprises a beam splitter and first and second reflectors for directing said beams in two branches defining a triangular topology, said corner-cube reflectors positioned between said first and second reflectors.

30. Apparatus as recited in claim 29 wherein said interferometer further comprises a beam splitter and first, second, third and fourth reflectors for directing said beams in two branches defining a quadrangular topology, said beam splitter positioned between said first and second reflectors and said corner-cube reflectors positioned between said second and third reflectors.

31. An interferometer as recited in claim 1 wherein said reference and object beams each comprise essentially laser radiation.

32. Apparatus as recited in claim 1 wherein said means for detecting said intensity fringes from said interferometer of said object beams comprises:
(a) a first detecting means for detecting said intensity fringes and for producing a first analog signal in response thereto,
(b) a second detecting means for detecting complementary intensity fringes from said interferometer, said second detecting means producing a second analog signal in response thereto,
(c) circuit means for subtracting said first and second analog signals to produce a third signal, said third signal being substantially free of intensity noise in the region of its maximum slope, and
(d) a discriminator circuit connected to receive said third signal, said discriminator circuit operable at the noise-free region of said third signal to produce said electrical signals corresponding to said object fringes.

33. Apparatus as recited in claim 32 wherein said first and second detecting means comprise photodiodes.

34. Apparatus as recited in claim 33 wherein said circuit means further comprises a current to voltage converter.

35. Apparatus as recited in claim 32 wherein said means for detecting said intensity fringes from said interferometer of said reference beam comprises:
 (a) a third detecting means for detecting said intensity fringes and for producing a third analog signal in response thereto,
 (b) a fourth detecting means for detecting complementary intensity fringes from said interferometer, said fourth detecting means producing a fourth analog signal in response thereto,
 (c) circuit means for subtracting said third and fourth analog signals to produce a fifth signal, said fifth signal being substantially free of intensity noise in the region of its maximum slope, and
 (d) a discriminator circuit connected to receive said fifth signal, said discriminator circuit operable at the noise-free region of said fifth signal to produce said electrical signals corresponding to said reference fringes.

36. Apparatus for measuring the wave number of an object beam of electromagnetic radiation using a reference beam of known wave number comprising:
 (a) an interferometer of the Michelson-type including reflection means and carriage means for translating said reflection means to provide a variable optical path for said reference and object beams,
 (b) means for directing said reference and object beams to said interferometer,
 (c) means for detecting intensity fringes from said interferometer of said reference and object beams as said carriage means is translated, said detecting means thereby providing electrical signals corresponding to said reference and object fringes,
 (d) means for phase-lock multiplying the electrical fringe signals of said object beam by L, L being an integer multiplier greater than unity to provide object submultiple signals equal in number to L times the number of electrical fringe signals of said object beam,
 (e) means for counting said object submultiple signals, and
 (f) means for controlling said counting means to count said object submultiple signals in response to said electrical fringe signals corresponding to said reference beam,
 whereby the number of object submultiple signals counted by said counting means corresponds to the wave-number of said object beam.

37. Apparatus as recited in claim 36 wherein said means for controlling said counting means comprises means responsive to reference submultiple signal derived from multiplying said electrical fringe signals corresponding to said reference beam by an integral number K.

38. Apparatus as recited in claim 37 wherein said controlling means comprises a presettable counter preset at a given integral number and connected to receive said reference submultiple signals, said presettable counter operative to count a given number of reference submultiple signals for controlling the counting of said means for counting said object submultiple signals.

39. Apparatus as recited in claim 38 wherein $K=L=100$.

40. Apparatus as recited in claim 38 further comprising means for selectively adjusting the integral value of K whereby the resolution of measurement may be selected.

41. Apparatus as recited in claim 38 further comprising means for presetting said presettable counter at said given number.

42. Apparatus as recited in claim 37 wherein multiplying by the integral number K is done by a phase-lock loop multiplier.

43. Apparatus as recited in claim 36 wherein said means for detecting said intensity fringes from said interferometer of said object beam comprises:
 (a) a first detecting means for detecting said intensity fringes and for producing a first analog signal in response thereto,
 (b) a second detecting means for detecting complementary intensity fringes from said interferometer, said second detecting means producing a second analog signal in response thereto,
 (c) circuit means for subtracting said first and second analog signals to produce a third signal, said third signal being substantially free of intensity noise in the region of its maximum slope, and
 (d) a discriminator circuit connected to receive said third signal, said discriminator circuit operable at the noise-free region of said third signal to produce said electrical signals corresponding to said object fringes.

44. An interferometer of the Michelson-type for measuring the wavelength or wave number of an object beam using a reference beam of known wavelength comprising:
 (a) a beam splitter,
 (b) means for directing said reference and object beams onto said beam splitter to form first and second pairs of reference/object beams,
 (c) a first and second corner-cube reflector,
 (d) first reflection means positioned to direct said first pair of reference/object beams to and from said first corner-cube reflector,
 (e) second reflection means positioned to direct said second pair of reference/object beams to and from said second corner-cube reflector, and
 (f) carriage means for supporting said first and second corner-cube reflectors and for moving said corner-cube reflectors along a fixed path.

45. An interferometer as recited in claim 44 wherein said corner-cube reflectors are mounted on opposite sides of said carriage means and positioned to reflect said object and reference beams in a direction parallel to the path travelled by said carriage means.

46. An interferometer as recited in claim 45 wherein said object and reference beams are spatially separated prior to entering said interferometer and remain spatially separated by passing through different segments of said corner-cubes whereby said object and reference beams are spatially separated upon leaving said interferometer.

47. An interferometer as recited in claim 45 wherein said object and reference beams spatially overlap.

48. A method of measuring the wavelength of an object beam of electromagnetic radiation using a reference beam in a Michelson-type interferometer comprising the steps of:
 (a) directing said object and reference beams into said interferometer,
 (b) detecting intensity fringes of said object and reference beams leaving said interferometer to produce electrical fringe signals,
 (c) multiplying said electrical reference fringe signals in a phase-lock loop multiplier to provide an L-fold multiplication thereof, thereby producing reference submultiple signals, L being an integral number multiplier, and (d) counting said reference submultiple signals while counting a given number of electrical fringe signals corresponding to said object beam, whereby said counted number of reference submultiple signals corresponds to the wavelength of said object beam.

49. A method as recited in claim 48 further comprising the steps of:

multiplying said electrical object beam signals by a phase-lock loop multiplier to provide a K fold multiplication thereof, thereby producing object submultiplie signals, K being an integral number multiplier, counting a given number of said object submultiple signals, and wherein said step of counting said reference beam submultiple signals comprises counting said reference submultiple signals while counting said given number of object submultiple signals and said given number is an integral number.

50. A method as recited in claim 49 further comprising the step of calculating the wavelength of said object beam from the formula:

$$\lambda_{ob} = \frac{us\, 5LC}{N}\left(1 + \frac{n_{ob}-n_{ref}}{n_{ref}}\right)$$

where:
$\lambda_{ob}$ = the object wavelength
C = the counted number of reference submultiple signals,
N = the given integral number equal to the counted number of object submultiple signals,
L = a multiplication factor,
$\lambda_{ref}$ = the known reference wavelength,
$n_{ob}$ = the index of refraction for the object beam, and
$n_{ref}$ = the index of refraction for the reference beam.

51. A method as recited in claim 48 wherein said step of detecting said intensity fringes of said object beam comprises the steps of:

(a) detecting intensity fringes from said interferometer in a first detecting means to produce a first analog signal, (b) detecting complementary intensity fringes from said interferometer in a second detecting means to produce a second analog signal, (c) subtracting said first and second analog signals to produce a third analog signal substantially free of intensity noise in the region of its maximum slope, and (d) generating said electrical fringe signals corresponding to said object beam by triggering a discriminator circuit on the noise free region of said third signal.

52. A method as recited in claim 51 wherein said step of detecting said intensity fringes of said reference beam comprises the steps of:

(a) detecting intensity fringes from said interferometer in a third detecting means to produce a third analog signal, (b) detecting complimentary intensity fringes from said interferometer in a fourth detecting means to produce a fourth analog signal, (c) subtracting said third and fourth analog signals to produce a fifth signal substantially free to intensity noise in the region of its maximum slope, and (d) generating said electrical fringe signals corresponding to said reference beam by triggering a discriminator circuit on the noise free region of said fifth signal.

53. A method of measuring the wave number of an object beam of electromagnetic radiation using a reference beam in a Michelson-type interferometer comprising the steps of:

(a) directing said object and reference beams into said interferometer, (b) detecting intensity fringes of said object and reference beams leaving said interferometer to produce electrical fringe signals, (c) multiplying said electrical object fringe signals in a phase-lock loop multiplier to provide an L-fold multiplication thereof, thereby producing object submultiple signals, L being an integral number multiplier, and (d) counting said object submultiple signals while counting a given number of electrical fringe signals corresponding to said reference beam, whereby said counted number of object submultiple signals corresponds to the wave number of said object beam.

54. A method as recited in claim 53 further comprising the steps of:

multiplying said electrical reference beam signals with a phase-lock loop multiplier to provide a K-fold multiplication thereof, thereby producing reference submultiple signals, K being an integral number multiplier, counting a given number of said reference submultiple signals, and wherein said step of counting said object beam submultiple signals comprises counting said object submultiple signals while counting said given number of reference submultiple signals and said given number is an integral number.

55. A method as recited in claim 53 wherein said step of detecting said intensity fringes of said object beam comprises the steps of:

(a) detecting intensity fringes from said interferometer in a first detecting means to produce a first analog signal, (b) detecting complmentary intensity fringes from said interferometer in a second detecting means to produce a second analog signal, (c) subtracting said first and second analog signals to produce a third signal substantially free of intensity noise in the region of its maximum slope, and (d) generating said electrical fringe signals corresponding to said object beam by triggering a discriminator circuit on the noise free region of said third signal.

56. A method as recited in claim 55 wherein said step of detecting said intensity fringes of said reference beam comprises the steps of:

(a) detecting intensity fringes from said interferometer in a third detecting means to produce a third analog signal, (b) detecting complementary intensity fringes from said interferometer in a fourth detecting means to produce a fourth analog signal, (c) subtracting said third and fourth analog signals to produce a fifth signal substantially free of intensity noise in the region of its maximum slope, and (d) generating said electrical fringe signals corresponding to said reference beam by triggering a discriminator circuit on the noise free region of said fifth signal.

57. Apparatus for measuring the wavelength of an object beam of collimated electromagnetic radiation using a reference beam of known wavelength comprising:

(a) an interferometer of the Michelson-type including reflection means and carriage means for translating said reflection means to provide a variable optical path for said reference and object beams, (b) means for directing said reference and object beams to said interferometer, (c) means for detecting intensity fringes from said interferometer of said reference and object beams as said carriage means is translated, said detecting means thereby providing electrical signals corresponding to said reference and object fringes, (d) means for phase-lock multiplying the number of electrical fringe signals of said reference beam by L, L being an interger multiplier greater than unity to provide reference submultiple signals equal in number to L times the number of electrical fringe signals of said reference beam, (e) means for detecting the number of reference submultiple signals, and (f) means for comparing the number of reference submultiple signals with the number of electrical signals corresponding to said object fringes.

58. Apparatus for measuring the wave number of an object beam of electromagnetic radiation using a reference beam of known wave number comprising:

(a) an interferometer of the Michelson-type including reflection means and carriage means for translating said reflection means to provide a variable optical path for said reference and object beams, (b) means for directing said reference and object beams to said interferometer, (c) means for detecting intensity fringes from said interferometer of said reference and object beams as said carriage means is translated, said detecting means thereby providing electrical signals corresponding to said reference and object fringes, (d) means for phase-lock multiplying the electrical fringe signals of said object beam by L, L being an integer multiplier greater than unity to provide object submultiple signals equal in number to L times the number of electrical fringe signals of said object beam, (e) means for detecting the number of object submultiple signals, and (f) means for comparing the number of object submultiple signals with the number of electrical signals corresponding to said reference fringes.

* * * * *

UNITED STATES PATENT AND TRADEMARK OFFICE
CERTIFICATE OF CORRECTION

PATENT NO. : 4,165,183
DATED : August 21, 1979
INVENTOR(S) : John L. Hall and Siu Au Lee It is certified that error appears in the above-identified patent and that said Letters Patent are hereby corrected as shown below:

Column 5, line 22 and claim 50, line 4, the portion of the formula reading "US5LC/N" should read --C$\lambda$ref/NL--.

Signed and Sealed this

Twenty-fifth Day of December 1979

[SEAL]

Attest:

SIDNEY A. DIAMOND

Attesting Officer

Commissioner of Patents and Trademarks